United States Patent [19]

Walker

[11] Patent Number: 5,051,603

[45] Date of Patent: Sep. 24, 1991

[54] METHOD AND APPARATUS FOR MATCHING TURN-OFF TIMES OF PARALLEL CONNECTED SEMICONDUCTOR SWITCHING DEVICES

[75] Inventor: Loren H. Walker, Salem, Va.

[73] Assignee: General Electric Company, Salem, Va.

[21] Appl. No.: 567,227

[22] Filed: Aug. 14, 1990

[51] Int. Cl.⁵ .................. H02J 5/00; H03K 17/732
[52] U.S. Cl. .................................. 307/73; 307/82;
307/86; 307/242; 307/633; 307/640; 307/645;
307/20; 363/137; 361/141
[58] Field of Search ................. 307/2, 18–22,
307/24, 26, 31, 33, 43–48, 53, 64–68, 70, 72, 73,
82, 85–87, 242, 246, 633, 640, 645, 491, 245,
306, 131; 363/57, 58, 135, 137, 138; 323/272;
361/141, 19

[56] References Cited

U.S. PATENT DOCUMENTS

| | | | |
|---|---|---|---|
| 3,633,046 | 1/1972 | Dewey | 307/645 |
| 4,612,561 | 9/1986 | Kimura et al. | 357/38 |
| 4,831,288 | 5/1989 | Chida et al. | 307/633 |
| 4,926,306 | 5/1990 | Ueda et al. | 363/58 |

Primary Examiner—A. D. Pellinen
Assistant Examiner—David Osborn
Attorney, Agent, or Firm—Arnold E. Renner

[57] ABSTRACT

A power switching system for controlling the conductivity of a plurality of thyristors of the gate turn-off type (GTOs) which are connected in parallel between two power sources by gradually introducing a time compensation to force the times of turn-off of each of the thyristors toward matched values by determining the turn-off time during each conduction cycle and thereafter advancing or retarding the turn-off signal for the following conduction cycle to correct for the difference in turn-off times. A difference signal is generated between time of turn-off of an average current of the thyristors and the time of turn-off of an individual current in one of the thyristors from which a time advance or delay signal is added to the thyristor turn-off signal in response to the current flowing in a capacitor type integrator. This allows the turn-off times to reach a perfect match during periods in which the current is the same for several cycles.

26 Claims, 5 Drawing Sheets

METHOD AND APPARATUS FOR MATCHING TURN-OFF TIMES OF PARALLEL CONNECTED SEMICONDUCTOR SWITCHING DEVICES

This invention was made with Government support under prime Contract No. DNA001-88-C-0028 (subcontract 19399-TSA-2) awarded by the Department of Defense. The Government has certain rights in this invention.

CROSS REFERENCE TO RELATED APPLICATION

This application is related to U.S. Ser. No. 07/382,942 pending entitled, "Method And Apparatus For Achieving Current Balance In Parallel Connected Switching Devices", Georges R. E. Lezan et al, filed July 20, 1989 and which is assigned to the assignee of this application.

BACKGROUND OF THE INVENTION

This invention relates generally to semiconductor switching devices such as thyristors and more particularly to a method and apparatus for maintaining a matched time of turn off for gate turn-off type thyristors operated in parallel between two electrical power sources and adapted to transfer electrical power between the two sources.

There are many applications where, because of current ratings, two or more switching devices are connected in parallel and controlled so that they are simultaneously conductive to transfer electrical power between a source and a load, the latter in certain applications also representing a source during certain phases of circuit operation. When the switching devices are of the non-proportional, semiconductor type, particularly thyristors including thyristors of the gate turn-off (GTO) type, it is desired not only to maintain current balance between the several parallely connected devices as shown and described in the above-referenced related application, U.S. Ser. No. 07/382,942, but also to have these devices become non-conductive simultaneously.

Accordingly, where there are several thyristors, hereinafter referred to simply as GTOs, which are connected in parallel and therefore carrying similar currents, are all given a signal to turn off, i.e. cease conduction at the same instant, the actual times of turn-off will be determined by the devices themselves. If the GTOs are perfectly matched, all of the devices will turn off concurrently; however, if otherwise, the first GTOs to turn off will tend to transfer their respective current to the remaining GTOs, with the result being that the last GTO to turn off is carrying substantially all of the current carried by the other GTOs which have since turned off. The amount of current carried by the last conducting GTO is a function of the turn-off times of the several GTOs and the effect of their respective snubber circuits.

Accordingly, prior art practice has either ignored the problem because time of turn off balancing control is unnecessary due to the relatively low current applications, or one must resort to extensive pretesting of whole groups of GTOs intended for use and thereafter using matched sets which have substantially the same turn-off times.

SUMMARY OF THE INVENTION

It is an object of the present invention, therefore, to provide an improvement in power switching systems.

It is an additional object of the invention to provide an improved power switching system employing a plurality of parallel connected switching devices.

It is a further object of the invention to provide a scheme for compensating for variations of turn-off times among the individual members of a set of parallel connected semiconductor devices connected between two electrical power sources.

It is another object of the invention to provide a scheme for compensating for variations of turn-off times among a plurality of parallel connected thyristors connected between two power sources.

It is still a further object of the invention to provide an improved method and apparatus for turning off a plurality of gate turn-off thyristors which are connected in parallel between two power sources, one of which comprises a current source.

The foregoing and other objects are achieved in accordance with this invention by providing a power switching system for controlling the conductivity of a plurality of thyristors of the gate turn-off type (GTOs) which are connected in parallel between two power sources by gradually introducing a time compensation to force the times of turn-off of each of the thyristors toward matched values by determining the times of turn-off during each conduction cycle and thereafter advancing or retarding the turn-off signal for the following conduction cycle to correct for the difference in turn-off times. A difference signal is generated between an average current of the thyristors and an individual current in one of the thyristors at the instant a turn-off signal appears from which a time related signal is added to the thyristor turn-off signal in response to the current flowing in a capacitor type integrator and allows the times of turn-off to reach a perfect match during periods in which the current is the same for several cycles.

BRIEF DESCRIPTION OF THE DRAWING

While the present invention is defined in particularity in the claims annexed to and forming a part of this specification, a better understanding of the invention can be had from the following description taken in conjunction with the, accompanying drawing in which:

DETAILED DESCRIPTION OF THE INVENTION

Figure 1:
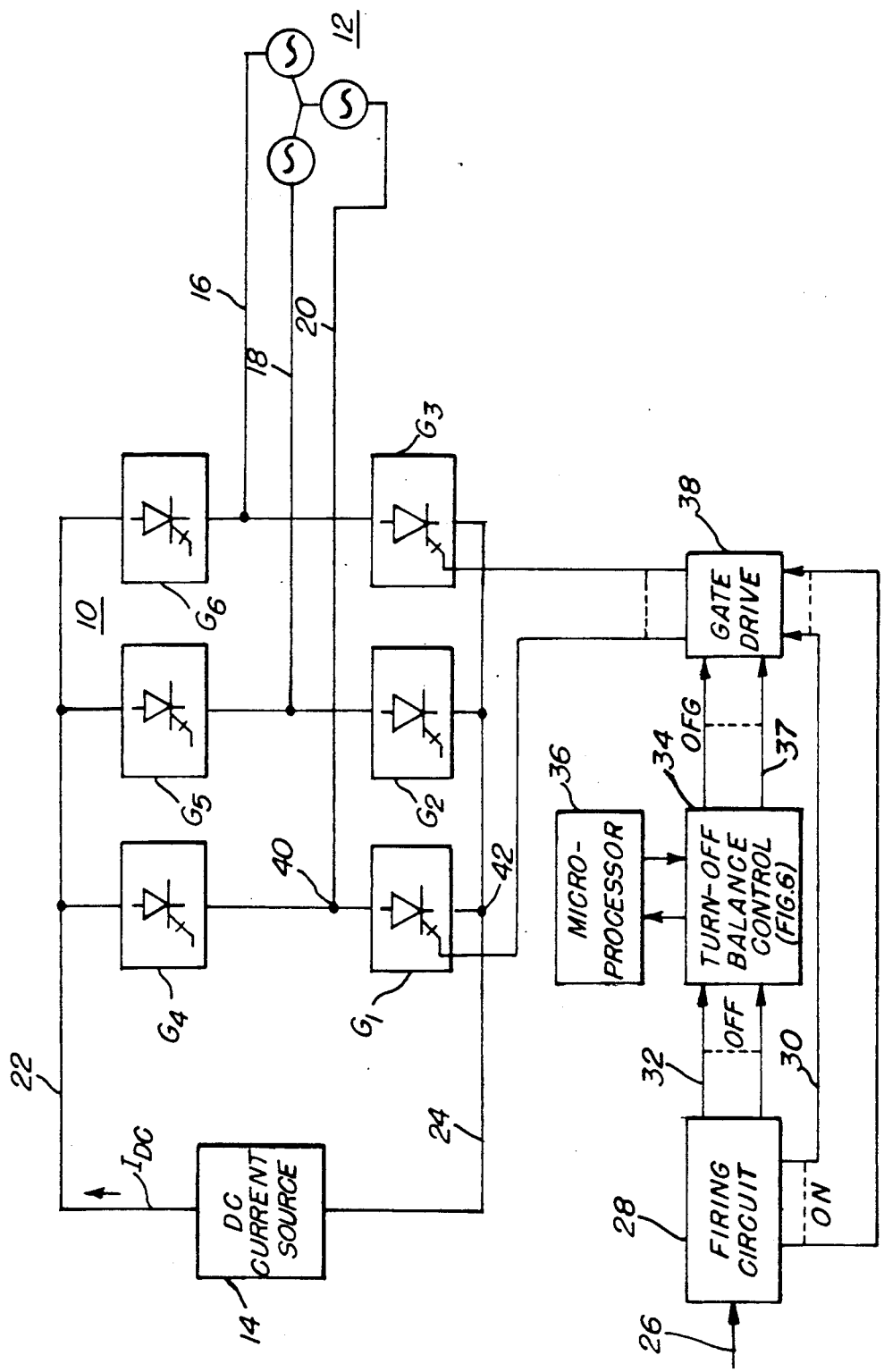
FIG. 1 is a schematic diagram illustrating a typical electrical power converter incorporating the present invention.
Figure 2:
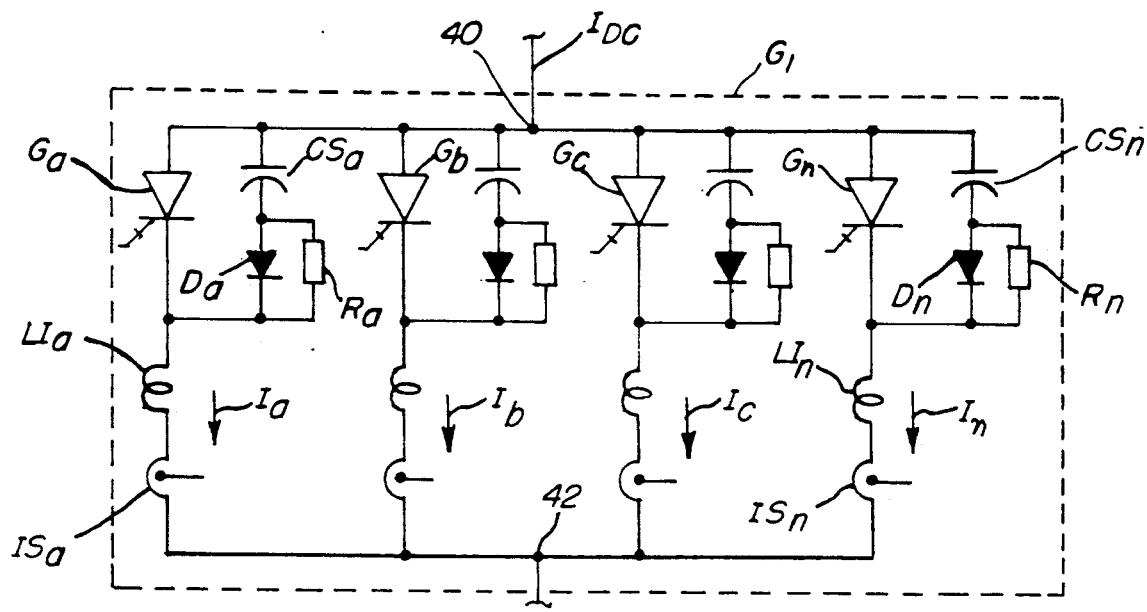
FIG. 2 is an electrical schematic diagram further illustrative of one portion of the bridge circuit shown in FIG. 1 and useful in understanding the present invention.

Referring now to the drawings and more particularly to FIG. 1, shown thereat is an electrical power converter including a three phase thyristor bridge 10 connected between two electrical power sources 12 and 14, the first comprising a three phase AC voltage source connected in a wye configuration and the second power source comprising a DC current source. The three phase bridge is comprised of six switching devices $G_1$–$G_6$ shown as turn-off thyristors (GTOs). Each of the GTOs $G_1$–$G_6$ is in actuality comprised of a plurality or set of parallel connected thyristors devices as shown in FIG. 2 and which also include respective series inductances.

The three phase AC source 12 is connected to the three phase bridge 10 via a three phase bus including the AC power lines 16, 18 and 20, while the DC current source 14 is connected to the bridge by way of a DC bus 20 including the two DC power lines 22 and 24. The DC current source 14 provides a current $I_{DC}$ which will flow within the GTOs $G_1$–$G_6$ during commutation. It should be noted that while the element 14 is indicated as a DC current source, in a more conventional sense, it may be considered as a load such as a large current carrying inductance. However, because of its inductive nature during periods of commutation of the devices $G_1$–$G_6$, element 14 will act as a current source for feeding energy to the AC source 12. A typical example of this type of current source comprises a Superconducting Magnetic Energy Storage System (SMES) wherein energy is stored in the magnetic field supported by current flowing in a superconducting solenoidal coil.

Control of the thyristor sets $G_1$–$G_6$, is the result of an input signal on line 26. This signal is only generically pertinent to the present invention and may emanate from any suitable source such as an operator control of automatic or manual nature. The function of the input on line 26 is simply to govern the overall level of system operation. The input on line 26 is coupled to a firing circuit 28 which generates a series of pulses provided on lines 30 which designate the time at which the GTO devices $G_1$–$G_6$ of the bridge 10 are to be fired, i.e. rendered conductive. In the same fashion, the firing circuit 28 generates a series of pulses provided on lines 32 which designate the time at which the plurality of the GTOs of the bridge are to be turned off, i.e. rendered non-conductive In accordance with the invention disclosed in the cross-referenced related application, U.S. Ser. No. 07/382,942 and herein incorporated by reference, the timing function of the firing or turn-on of the devices is described. In the present invention, the turn-off timing function is modified in accordance with the operation of a balance control circuit 34, with one control circuit being used for each set of thyristors $G_1$–$G_6$, one set of which, $G_1$, is shown in FIG. 2. A microprocessor 36 is also shown coupled to the turn-off balance control circuit 34 in order to allow a safer restart following a shut-down of the system, as will be subsequently explained. The turn-off balance control circuit 34 applies turn-off control signals OFG on lines 37 to a gate drive circuit 38 Accordingly, balanced turn off is provided by pulses applied to the thyristors bridge via a gate drive circuit 38 to the converter bridge 10.

Prior to discussing the details of the circuitry for implementing the subject invention, it becomes desirable to first consider the underlying problem which is being solved thereby. If there are several GTOs which are connected in parallel and carrying similar currents and they are all given a signal to turn off (i.e., to become non-conductive) at the same instant, the actual turn-off time will be determined by the devices themselves. The first GTOs to turn off will tend to transfer their current to the remaining GTOs such that the last GTO may be required to turn off a very large current. Normally the snubbers comprised of the well known combination of a diode and resistor coupled in parallel to a capacitor with the combination shunting the thyristor, determine the amount of overcurrent the last device must turn off.

Considering now the relation which controls the magnitude of the overcurrent, reference will be made to FIG. 2 where a plurality of GTO's $G_a$–$G_n$ constitute one thyristor set $G_1$ of the bridge 10 shown in FIG. 1. Each GTO, for example, $G_a$, includes a snubber circuit including capacitor $CS_a$ a fast recovery semiconductor diode $D_a$ and a fixed resistor $R_a$, connected in series to a di/dt inductor $LI_a$ and a current sensor $IS_a$. When all of the GTOs $G_a$, $G_b$ ... $G_n$ are conductive, the currents $I_a$, $I_b$, $I_c$ ... $I_n$ flow in the respective current paths between circuit nodes 40 and 42.

Figure 3:
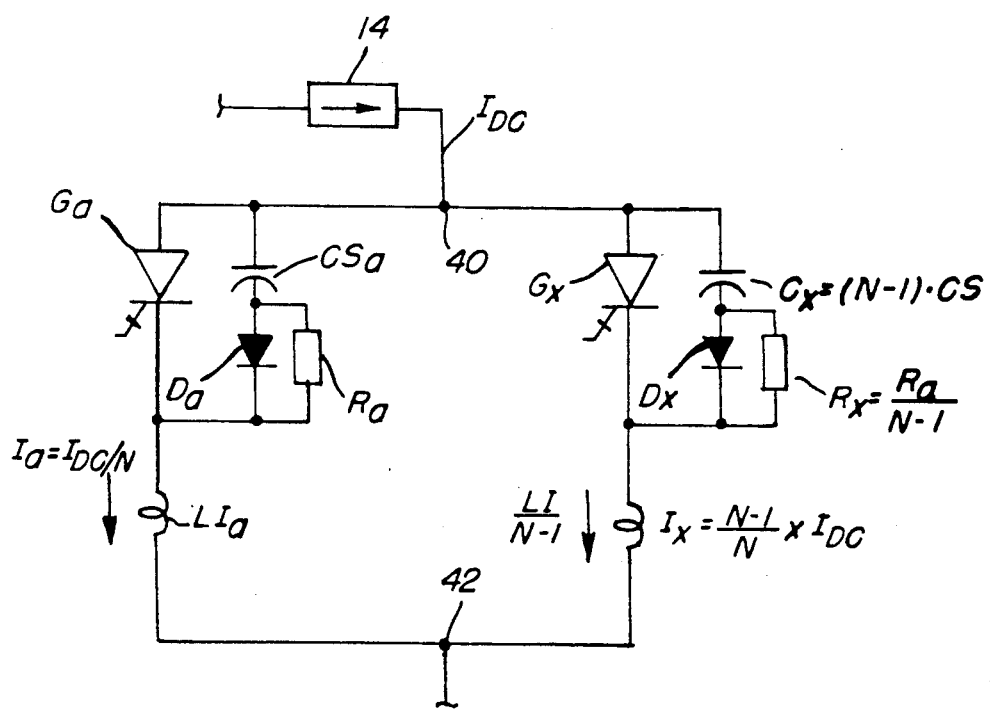
FIG. 3 is an electrical equivalent circuit of the circuit shown in FIG. 2.

The circuit as shown in FIG. 2 can be simplified as shown in FIG. 3. There the plurality (N) of parallel GTOs are considered as simply two devices with the GTO on the right, shown by reference character $G_x$, representing N−1 GTOs with the respective snubber circuitry. These GTOs are all considered to be having the shortest turn-off time within the range of turn-off times characteristic of this device type. The GTO on the left, i.e. $G_a$, represents the last GTO to turn off and for the sake of illustration, is considered to have the longest turn-off time characteristic of this device type. This then represents a worst case scenario for an overcurrent condition of $G_a$–$G_n$ at turn-off. The currents in the GTOs comprise the respective currents $I_a$ and $I_x$ just before turn-off and are considered to be perfectly shared. That is indicated by $I_a = I_{DC/N}$ where N is equal to the total number of GTOs in the set $G_1$ and where $I_x = (N-1/N) * I_{DC}$. Any lack of perfect sharing before turn-off must be added to the current increase at turn off to find the total turn-off rating of the GTO.

Figure 4:
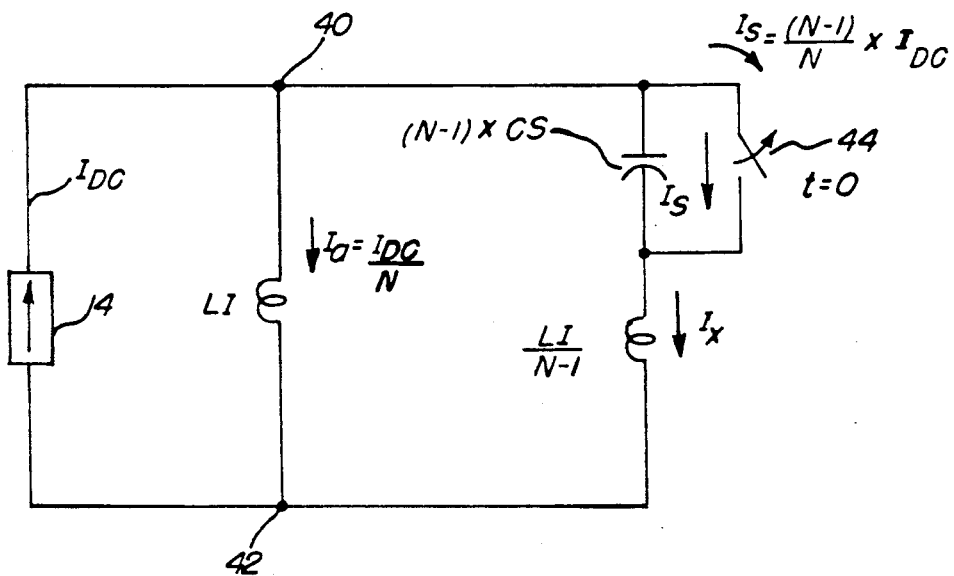
FIG. 4 is a simplified equivalent circuit of the circuit shown in FIG. 3 when the thyristor $G_x$ turns off.
Figure 5:
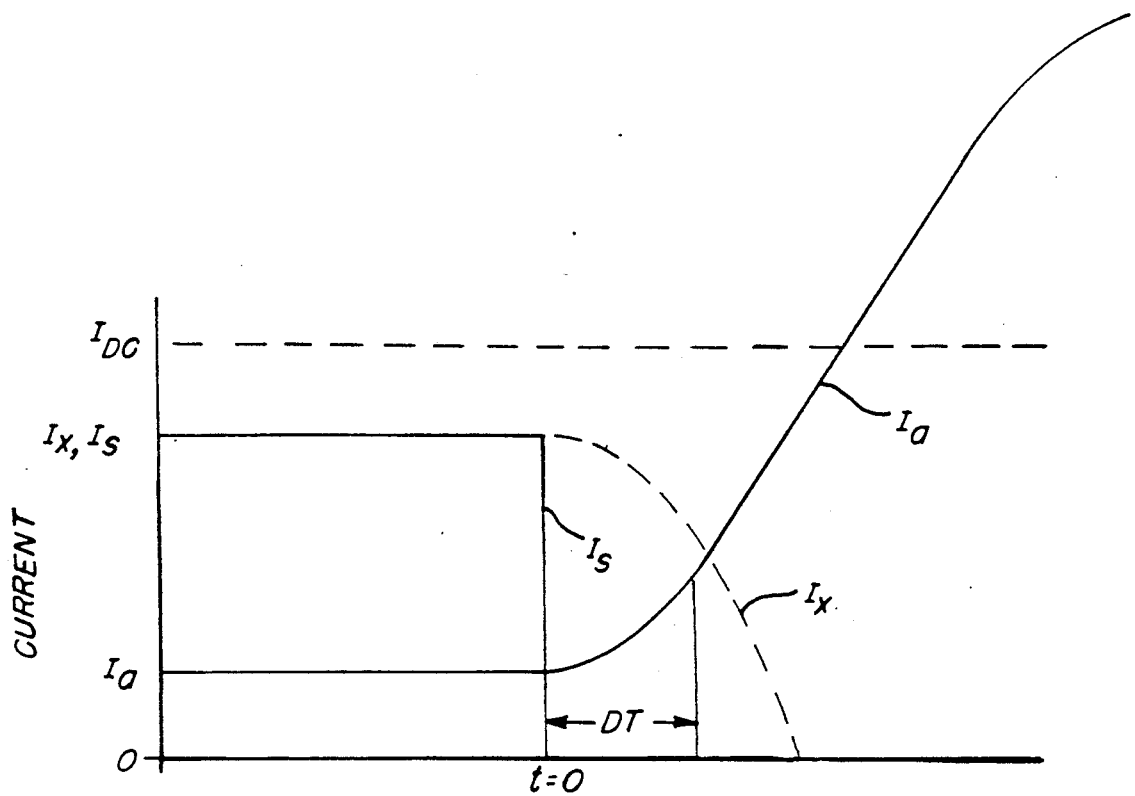
FIG. 5 is a set of waveforms illustrative of the currents in the equivalent circuit of FIG. 4 at turn-off of $G_x$.

Considering now FIG. 4, shown thereat is the equivalent circuit of FIG. 3 when thyristor $G_x$ turns off at $t=0$. $G_x$ is depicted simply as an open switch 44. The current waveforms accompanying this condition are furthermore shown in FIG. 5. As shown, prior to turn-off at $t=0$, the currents $I_x$ and $I_a$ are constant valued. At the instant of turn-off, $I_x$ which is the current through $G_x$ goes to zero. The current $I_x$, on the other hand, decreases sinusoidally inasmuch as the current through the inductor $LI/N-1$ cannot cease instantaneously. The current through the last GTO, i.e. $G_a$ and which is represented by the current $I_a$ rises as shown according to the expression:

$$I_a = I_{DC}[1/N + (N-1/N)*(1-\cos w_0 t)] \quad (1)$$

where $w_0$ equals the resonance frequency of the equivalent circuit, and which is expressed by:

$$w_0 = 1/\sqrt{LI * CS * N} \quad (2)$$

where N is the total number of GTOs, LI is the inductance in series with each GTO, CS is the snubber capacitance associated with each GTO, and t is the time measured from the opening of the switch.

To find the current turned off by $G_a$, the slowest GTO, one substitutes the proper circuit parameters and for the time t one substitutes into expression (1) the value DT. DT is the maximum difference in turn-off time between the slowest and the fastest GTOs. For large GTOs, typical parameter values are: CS=6uF, LI=15uHy and DT=6μSec, the latter being an indication of the maximum difference in device turn-off times.

In some applications, the current values are sufficiently low that the extra current turned off will not harm the last GTO to turn off where there is disparity in turn-off times; however, the expressions provided above permit one to make an evaluation of the power circuit design to determine if turn-off balancing control is necessary.

In any event, the proposed method and apparatus for accommodating a wide spread, e.g., 6 μsec., in turn-off time in accordance with this invention depends on the fact that DC current cannot change quickly with respect to a single cycle of the thyristor bridge 10 shown in FIG. 1. The turn-off time balance control scheme proposed herein measures the GTO turn-off time characteristics and gradually introduces a compensation by way of a time advance or time delay to the turn-of control signal to force the turn-off time toward matched values.

Figure 6:
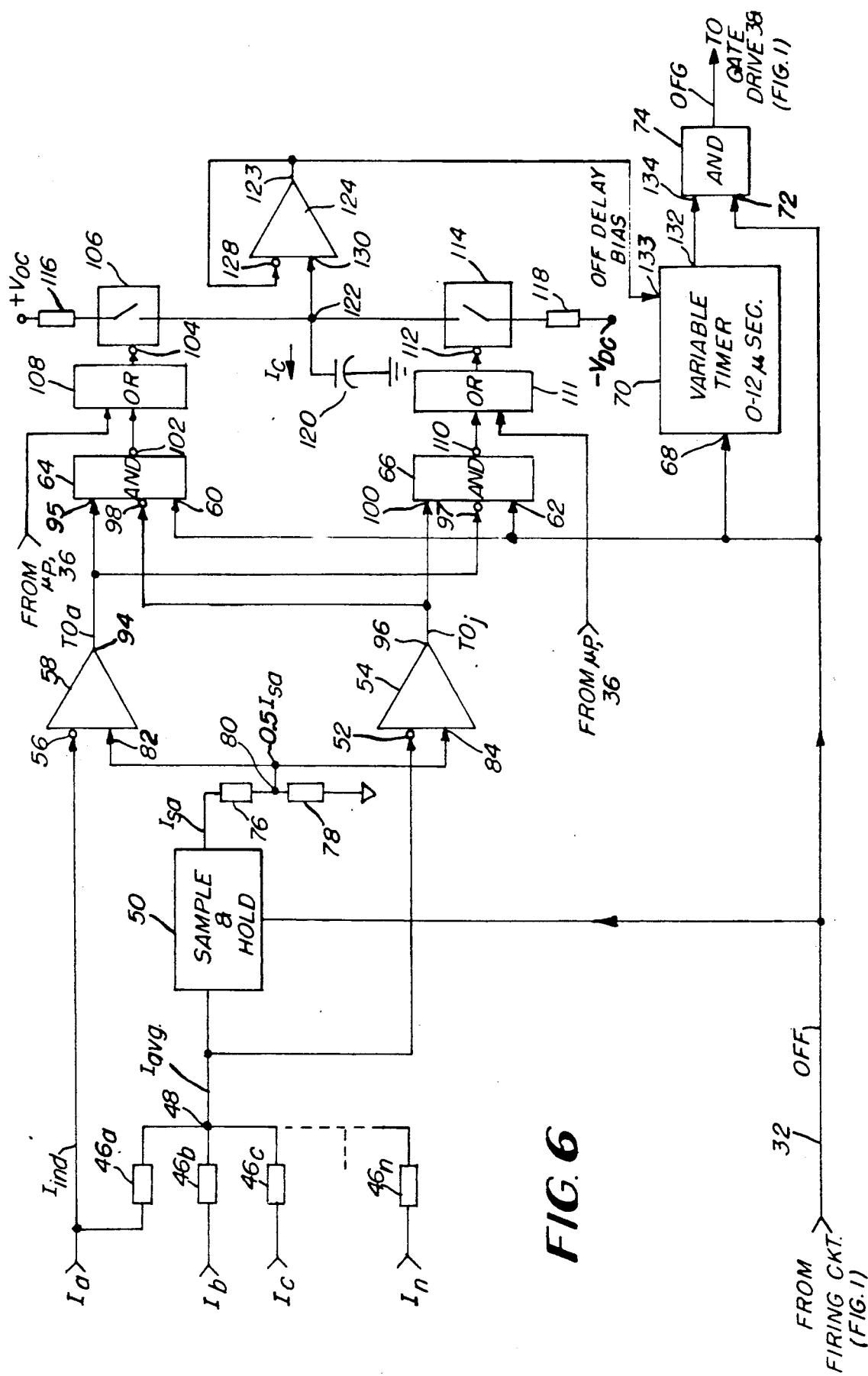
FIG. 6 is an electrical block diagram illustrative of the preferred embodiment of the present invention.
Figure 7:
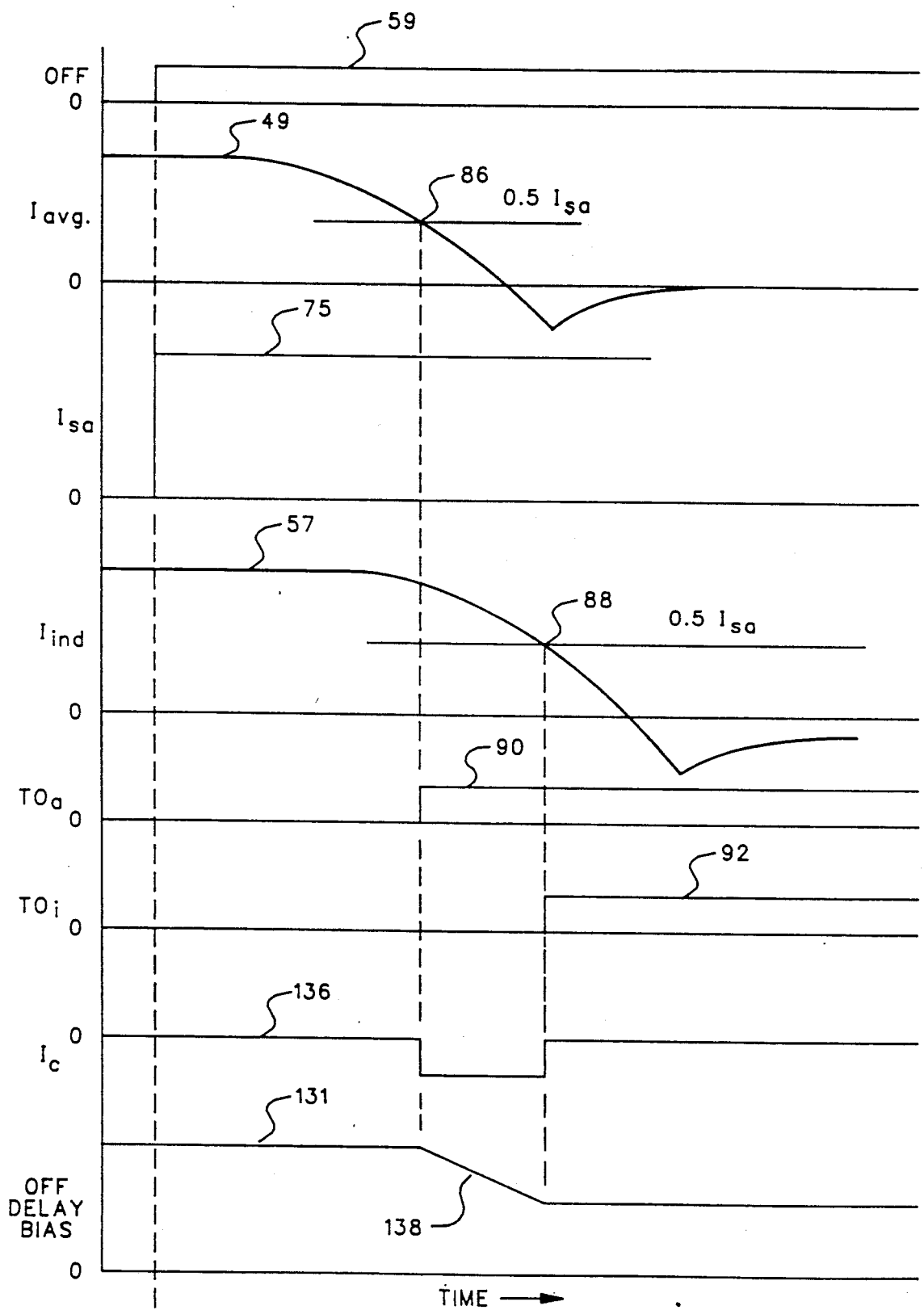
FIG. 7 is a set of waveforms illustrative of the operation of the embodiment shown in FIG. 6.

This now leads to a consideration of FIG. 6, which depicts the preferred embodiment for balancing the turn-off times of one set of GTOs of the bridge 10 and more particularly the thyristor leg $G_1$. The same circuitry would be required for each of the other legs $G_2$–$G_6$. FIG. 7 depicts various waveforms for this circuit. Current signals $I_a$, $I_b$, $I_c$ ... $I_n$ from the respective current sensors $I_{S_a}$–$I_{S_n}$ (FIG. 2) which are in series with the respective GTOs and their snubbers, are combined to provide a signal indicative of the total current in the several GTOs. In FIG. 6 this latter signal is provided by combining the several current signals in resistors $46_a$, $46_b$, $46_c$ ... $46_n$ to form an average- current signal value $I_{avg}$ of all the currents at circuit node 48. This signal $I_{avg}$ (waveform 49) is applied to a sample and hold circuit 50 as well as to the inverting input 52 of a first signal comparator circuit 54. One of the current signals, $I_a$ for example, is fed to the inverting input 56 of a second comparator 58 and is designated the individual current signal $I_{ind}$. It is illustrated as waveform 57 in FIG. 7. The sample and hold circuit 50 also receives a logic input signal designated OFF, shown by reference numeral 59 in FIG. 7, which comprises a signal to command the GTO array $G_1$ (FIG. 2), for example, to turn off. Again, this would be duplicated for the GTO thyristor sets $G_2$–$G_6$. This signal is typically generated 6 μsec. before the GTOs $G_a$–$G_n$ are expected to turn off. In addition to being applied to the sample and hold circuit 50, the OFF signal is commonly applied to the non-inverting inputs 60 and 62 of a pair of AND gates 64 and 66, to one input 68 of a variable timer circuit 70 and one non-inverting input 72 of an AND gate 74.

At the instant the OFF signal appears, the sample and hold circuit 50 senses and holds the value of the average current signal $I_{avg}$ and outputs a constant value DC signal $I_{sa}$ as shown by waveform 75 (FIG. 7). The signal is fed to a resistive voltage divider network comprised of two fixed resistors 76 and 78 which operate to divide the signal in half, thus providing a current signal of $0.5\,I_{sa}$ at circuit node 80. This latter signal acts as a reference signal and is commonly coupled to non-inverting inputs 82 and 84, respectively, of the two comparators 58 and 54. The two comparators 58 and 54, respectively, compare the individual current signal $I_{ind}$ and the average current signal $I_{avg}$ to the reference signal $0.5\,I_{sa}$. When the current signal $I_{ind}$ and $I_{avg}$ drop below the value of $0.5\,I_{sa}$, as shown by waveform segments 86 and 88, turn-off signals $TO_i$ or $TO_a$, respectively, are generated as shown by waveforms 90 and 92 and appear at the respective outputs 94 and 96 of the comparators 58 and 54. The signal $TO_a$ is commonly coupled to a second non-inverting input 95 of AND gate 64 and the inverting input 97 of AND gate 66. In a like manner, the signal $TO_i$ is commonly applied to the inverting input 98 of AND gate 64 and a second non-inverting input 100 of AND gate 66.

The two AND gates 64 and 66 combine to form a simple time or phase discriminator to determine which of the two signals $TO_a$ or $TO_i$ appears first. The inverting output 102 of the AND gate 64 is coupled to the inverting input 104 of a digital logic switch 106 through an OR gate 108 which operates to additionally couple a logic signal from the microprocessor 36 (Figure for purposes which will be explained subsequently. In a like manner, the inverting output 110 of the AND gate 66 is coupled to the inverting input 112 of a second logic switch 114, via OR gate 111. The switches 106 and 114 are coupled in series between a pair of fixed resistors 116 and 118, with the entire series circuit being coupled across a source of DC supply voltage $V_{DC}$.

A current integrator in the form of an integrating capacitor 120 is connected between the switches 106 and 114 at circuit node 122 with the other side of the capacitor being connected to ground. The two switches 106 and 114 together with the capacitor 120 form a "charge pump" which generates a signal to control the variable timer 70. The voltage across the capacitor 120 is buffered by an operational amplifier 124 connected as voltage follower by having its output 123 connected to its inverting input 128. The other input 130, a non-inverting input, is connected to the circuit node 122. The output 123 of the voltage follower comprises a delay signal designated OFF BIAS DELAY (waveform 131) and is coupled to the input 133 of the timer 70 whose output 132 is coupled to one input 134 of the AND gate 74.

In operation, if the average current signal $I_{avg}$ drops below the reference $0.5I_{sa}$ first, as shown in FIG. 7, then the switch 114 is closed from the time the current signal $I_{avg}$ drops until the individual current signal $I_{ind}$ drops below $0.5I_{sa}$. This injects a negative current pulse $I_c$ into capacitor 120 as shown by waveform 136. Similarly, if the individual current $I_{ind}$ falls first, switch 106 is closed from the time the individual current $I_{ind}$ falls until the average current signal $I_{avg}$ falls. This will inject a pulse of positive current into the capacitor 120. The voltage on capacitor 120 is the integral of all current pulses delivered to the capacitor. It is affected by the current pulse $I_c$ as shown at portion 138 of waveform 131

The timer 70 produces an output delayed 0–12 μsec. depending upon the value of the OFF DELAY BIAS voltage. This delayed signal is ANDed with the OFF signal in the AND gate 74 to advance or retard the signal OFG which is coupled to the gate drive circuit 38 (FIG. 1) to turn off the GTO designated $G_a$ in FIG. 2. This is the GTO which carries the sensed current $I_{ind}$. If the GTO $G_a$ inherently turns off at exactly the same time as the average of all the remaining GTOs, i.e.

$G_b-G_n$, then the OFF DELAY BIAS is zero and the timer 70 causes a delay of 6 μsec., which exactly accounts for the 6 μsec. lead in the OFF signal from the firing circuit 28. If the turn-off time of $G_a$ is long, the OFF DELAY BIAS will be pulled to a more negative voltage on every turn-off pulse. This causes the variable timer 70 to insert ever shorter delays to account for this slowness until it has restored the match or time coincidence of the signals $TO_a$ and $TO_i$. Alternatively, if the turn-off of $G_a$ is faster than the average time of GTOs $G_b-G_n$, the circuit responses symmetrically in the opposite sense to delay the signal OFG by more than 6 μsec. It should be noted in certain applications it is only necessary for the voltage to move in one direction and therefore zero volts would correspond to a zero delay or advance time.

This concept is particularly useful with a converter for a Super Conducting Magnetic Energy Storage (SMES) system, because the turn-off control circuitry shown in FIG. 6 can respond more quickly than is possible for any current change in a SMES system. Since current changes so little on a cycle-by-cycle basis, substantially perfect turn-off time matching can be maintained.

One of the problems which can arise is that of initializing the value of the OFF DELAY BIAS signal. At initial turn on of the equipment, the OFF DELAY BIAS can be set at zero volts by a simple bleeder resistor network, not shown. A more difficult situation presents itself, however, when the converter 10 as shown in FIG. 1 is shut down and when the current source 14 is an SMES coil operating at high current. One type of operating sequence would be to close a metallic short and bypass the converter when the SMES coil is fully charged while awaiting the need for peaking power. In such a sequence, however, the converter could be expected to come on and switch full current on the first half cycle. If the parameters are such that turn-off time matching is critical to safe operation, it becomes imperative to account for this condition. In this invention, it is accounted for by the inclusion of the microprocessor 36 (FIG. 1) which scans and records all the values of all the OFF DELAY BIAS signals for all six sets of GTOs $G_1-G_6$ included in the converter 10. Then if the converter 10 is shut down and restarted, the microprocessor merely reestablishes the last value of the OFF DELAY BIAS by appropriately operating the switches 106 and 114 through the two OR gates 108 and 111 and thus will allow a safe restart at high current.

Thus what has been shown and described is a relatively simple yet effective means for compensating for variations of turn-off times among the several members of a set of paralleled GTOs With a large number of GTOs, in apparatus such as the converter for a SMES, the quantity of GTOs required could represent the entire yield of a semiconductor vendor for a relatively long period of time. While it might be possible to sort these devices into sets by turn-off time and to maintain spares of all grades to allow replacement with a properly selected device, the cost and difficulty of this grading system must be compared to the cost of the turn-off time matching circuitry as heretofore disclosed. The circuitry in accordance with this invention is particularly beneficial if current sensors are required on a per GTO basis for other reasons such as active current balancing and diagnostics. The control circuitry on a per GTO basis is so small that it may well be economically more feasible than any other method of accomplishing a turn-off time matching such as resorting to pre-testing the GTOs to determine their respective actual turn-off times Having thus shown and described what is at present considered to be the preferred embodiment of the invention, it should be noted that the same has been made by way of illustration and not limitation and thus modifications thereto will readily occur to those skilled in the art. For example, the applicability of the present invention to other switching devices besides GTOs is contemplated. It is also possible that the single switching device in each parallel leg could be replaced by plural devices in series. It is to be specifically recognized that although analog implementations, which are better able to give an understanding of the invention, have been illustrated, digital equivalents are clearly considered to be within the scope of the invention as claimed. It is not desired, therefore, that the invention be limited to the specific embodiments shown and described, but it is intended to include within the appended claims all such modifications as fall within the true spirit and scope of the invention.

What is claimed is:

1. In a power switching system of the type employing a plurality of switching devices connected in parallel between two electrical power sources, said devices configured to be simultaneously conductive or simultaneously non-conductive and being rendered individually non-conductive in response to the application of respective turn-off control signals, a method of controlling turn-off of said devices to produce a time of turn-off balance within said switching devices comprising the steps:

(a) generating individual current signals respectively representative of the current magnitude within each switching device;
   (b) generating an additional current signal representing a total current within said plurality;
   (c) generating an individual time signal when the magnitude of said individual current signals indicate that a respective device has turned off;
   (d) generating a total time signal when a magnitude of said additional current signal indicates that all devices have turned off;
   (e) generating a difference signal at an occurrence of a turn-off control signal for said switching device as a function of a difference in time between one of said individual time signals and said total time signal; and
   (f) varying the time of application of the turn-off control signal for a next conduction cycle of said plurality of switching devices as a function of said difference signal.

2. The method in accordance with claim 1 wherein said additional current signal represents an average of said individual current signals.

3. The method in accordance with claim 1 wherein said step (f) of varying the time advances the time for a first type difference signal and delays the time for a second type difference signal.

4. The method in accordance with claim 1 wherein said step (f) of varying the time comprises increasing or decreasing a signal output of a signal integrator in response to said difference signal.

5. The method in accordance with claim 4 wherein said signal integrator comprises a capacitor, and wherein said step of increasing and decreasing said signal output comprises increasing and decreasing an electrical charge on said capacitor.

6. The method in accordance with claim 1 wherein each said switching device comprises one of a set of parallel connected gate turn-off thyristors in a power converter.

7. The method in accordance with claim 6 wherein one of said power sources comprises a current source.

8. In a power switching system of the type employing a plurality of switching devices connected in parallel between two electrical power sources, one of which comprises a DC current source, said devices configured to be simultaneously conductive or simultaneously non-conductive and being rendered individually non-conductive in response to an application of respective turn-off control signals, a method of controlling turn-off of said devices so as to force a time of turn off of all said devices to be the same where individual turn-off times of the respective devices are not necessarily the same, comprising the steps:
   (a) generating individual current signals respectively representative of the current magnitude within each of said switching devices;
   (b) generating an average current signal representing the average current magnitude within said plurality of switching devices;
   (c) generating a turn-off control signal for said switching devices;
   (d) generating a reference signal from said average current signal;
   (e) generating a first signal when the magnitude of a selected one of said individual current signals is less than said reference signal;
   (f) generating a second signal when the magnitude of said average current signal is less than said reference signal; and
   (g) adjusting a time of application of the turn-off control signal for a following conduction cycle of said devices as a function of a time difference between said first or second signal.

9. The method in accordance with claim 8 wherein said step (g) of adjusting the time of application of the turn-off control signal includes advancing or delaying said time of application depending on which of said first and second signal is generated first.

10. The method in accordance with claim 9 and wherein the amount of advancing or delaying is a function of the time difference between like portions of said first and second signals.

11. The method in accordance with claim 8 wherein said step (g) of adjusting the time of application of the turn-off control signals includes increasing a signal output of a signal integrator when said first signal is generated prior to said second signal and decreasing the signal output of said integrator when said second signal is generated prior to said first signal.

12. The method in accordance with claim 11 wherein said signal integrator comprises a capacitor, and said increase and decrease in said signal output comprises an increase and decrease in electrical charge on said capacitor.

13. The method in accordance with claim 12 wherein said step (g) of adjusting the time additionally includes a step of controlling a variable timer circuit in response to the charge on said capacitor and controlling the turn-off control signal by an output of the timer circuit.

14. In a system including a power converter having at least one set of switching devices comprised of a plurality of devices connected in parallel for transferring electrical power between two electrical power sources, a turn-off balance control circuit for rendering the devices of said set of switching devices non-conductive simultaneously, comprising:
   (a) means for generating individual current signals respectively representative of a current and magnitude within each of said switching devices;
   (b) means coupled to said current signals for generating an average current signal representing an average current magnitude within said plurality of switching devices;
   (c) means for generating a turn-off control signal for said switching devices;
   (d) means coupled to said average current signal for generating a reference signal;
   (e) means coupled to a selected one of said individual current signals, said average current signal and said reference signal for generating a first signal when the magnitude of said one individual current signal is less than said reference signal;
   (f) means coupled to said one individual current signal, said average current signal and said reference signal for generating a second signal when the magnitude of said average current signal is less than said reference signal; and
   (g) means coupled to said first and second signals for adjusting a time of application of the turn-off control signal for a following conduction cycle of said devices as a function of a time difference between said first or second signals.

15. The control circuit in accordance with claim 14 wherein said switching devices comprise gate turn-off thyristors.

16. The control circuit in accordance with claim 14 wherein one of said power sources comprises a DC current source.

17. The control circuit in accordance with claim 16 wherein the other of said power sources comprises a polyphase AC voltage source, said power converter comprises a bridge circuit including plural sets of thyristors and wherein a respective said control circuit is coupled to each said set of thyristors.

18. The control circuit in accordance with claim 17 wherein said thyristors comprise gate turn-off thyristors.

19. The control circuit in accordance with claim 14 wherein said means for adjusting the time of application of the turn-off control signal comprises means for advancing and retarding the time of application of the turn-off control signal.

20. The control circuit in accordance with claim 19 wherein said means for advancing and retarding includes a signal integrator having an output signal which increases in magnitude when said first signal is generated before said second signal and decreases in magnitude when said second signal is generated before said first signal.

21. The control circuit in accordance with claim 20 wherein said signal integrator comprises a capacitor and additionally including means for increasing a charge on the capacitor when said first signal occurs first in time with respect to said second signal and decreasing said charge when said first signal occurs second in time with respect to said second signal.

22. The control circuit in accordance with claim 20 wherein said means for increasing and decreasing charge on the capacitor comprises a pair of electrical switches coupled to and respectively coupling said capacitor to oppositely poled voltages of a DC source when closed, said electrical switches further being closed in response to said first and second signals.

23. The control circuit in accordance with claim 21 and additionally including a variable timer circuit controlled by said output voltage across said capacitor, said timer circuit generating an output signal which is combined with said turn-off control signal to turn off said thyristors.

24. The control circuit in accordance with claim 23 and additionally including voltage follower circuit means coupled between said capacitor and said variable timer circuit.

25. The control circuit in accordance with claim 24 wherein said means for generating said first and second signals comprise a first signal comparator coupled to said one individual current signal and said reference signal and being operable to generate said first signal, and a second signal comparator coupled to said average current signal and said reference signal and being operable to generate said second signal.

26. The control circuit in accordance with claim 25 wherein said means for generating a reference signal comprises a sample and hold circuit coupled to said average current signal and being controlled to store the value of said average current signal in response to the application of said turn-off control signal thereto and being operable to provide a fixed valued output signal of average current; and a voltage divider network coupled to said fixed valued output signal and providing a lesser valued output signal from said fixed valued output signal, said lesser valued output signal being coupled to said first and second comparator circuits for comparison with said one individual current signal and said average current signal.

* * * * *